United States Patent
Peckham et al.

(10) Patent No.: US 6,298,224 B1
(45) Date of Patent: Oct. 2, 2001

(54) MULTIPLE FREQUENCY BAND RECEIVER

(75) Inventors: David S. Peckham, Barrington Hills; David Z. Ding, Hainesville; Frank Skutta, Palatine; Robert M. Johnson, Jr., Lake Zurich, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/255,181

(22) Filed: Feb. 22, 1999

(51) Int. Cl.$^7$ .................................................. H04B 1/18
(52) U.S. Cl. .................. 455/188.1; 455/307; 455/339
(58) Field of Search ............................. 455/150.1, 280, 455/176.1, 188.1, 191.1, 191.3, 227, 302, 306, 307, 339, 20 C

(56) References Cited

U.S. PATENT DOCUMENTS

| | | | |
|---|---|---|---|
| 5,794,159 | * 8/1998 | Portin | 455/553 |
| 5,896,562 | * 4/1999 | Heinonen | 455/76 |
| 5,926,751 | * 7/1999 | Vlahos et al. | 455/280 |
| 5,974,305 | * 10/1999 | Matero | 455/188.1 |
| 5,999,824 | * 12/1999 | Na | 455/553 |
| 6,029,052 | * 2/2000 | Isberg et al. | 455/131 |
| 6,091,966 | * 7/2000 | Meadows | 455/553 |
| 6,125,271 | * 9/2000 | Rowland, Jr. | 455/313 |

\* cited by examiner

*Primary Examiner*—Nay Maung
(74) *Attorney, Agent, or Firm*—Randall S. Vaas

(57) ABSTRACT

A multiple frequency band receiver (102) receives at least two frequency bands that are close but not adjacent. A first bandpass filter (304) passes signals in the first frequency band. A second bandpass filter (306) passes signals in the second frequency band. The first and second filters each attenuate signals between the first and second frequency band to at least a first level so as to provide selectivity in the frequency range between the first and second frequencies to prevent the signals between these frequency bands from being further processed by the communication device. A third filter (322) coupled to first and second filters passes signals in both the first and second frequency band and attenuates signals above the pass band of the higher of the first and second filters and below the lower of the first and second filters.

18 Claims, 4 Drawing Sheets

MULTIPLE FREQUENCY BAND RECEIVER

FIELD OF THE INVENTION

The present invention pertains to receivers, and more particularly to multiple band receivers.

BACKGROUND OF THE INVENTION

A variety of communication devices are known that operate in multiple frequency bands. For example, radiotelephones for operation in both the 900 MHz global system for mobile communications (GSM) standard and the 1.8 GHz digital cellular standard (DCS) specification in Europe are known. Dual band communication devices are also known to operate in the 800 MHz and 1.9 GHz frequency band in countries such as the United States of America.

In such communication devices, the receiver must provide adequate attenuation of signals outside of the receiver passbands. It is also necessary to separate signal paths for each of the passbands. Because the frequency bands are so far apart, the receive signals in the frequency band can be separated using a simple diplexer. Adequate attenuation is provided through the use of multiple filters. However as the number of passbands increases, the size and cost requirements of all of the filters increases detrimentally.

There is therefor a need for cost effective solutions for implementing receivers that operate in multiple frequency bands, as well as implementations that accommodate an increased number of frequency bands on smaller circuit boards and in smaller housings.

DETAILED DESCRIPTION OF THE INVENTION

Figure 1:
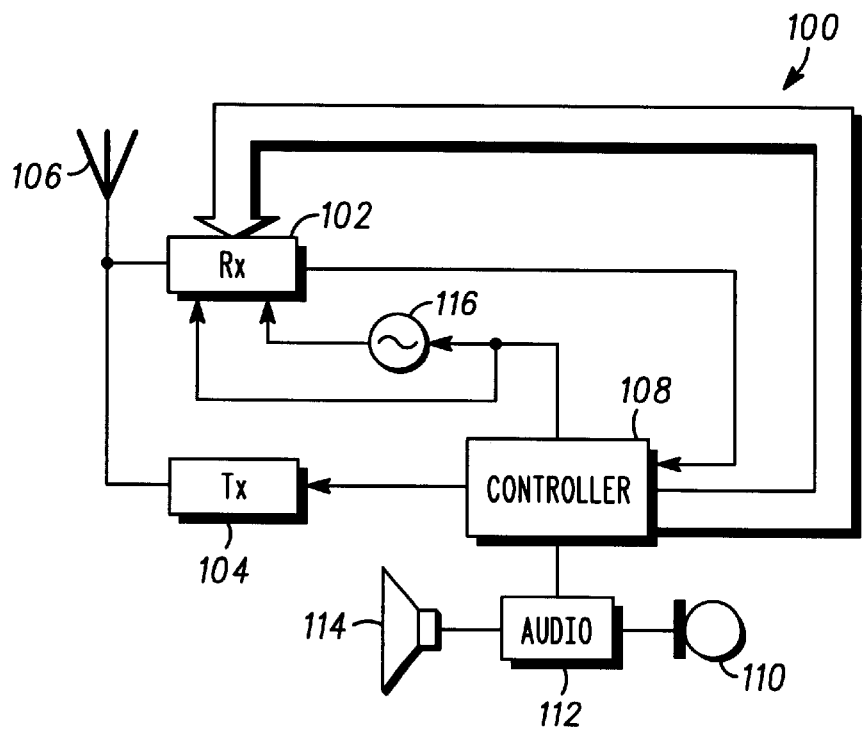
FIG. 1 is a circuit schematic in block diagram illustrating a wireless communication device.
Figure 2:
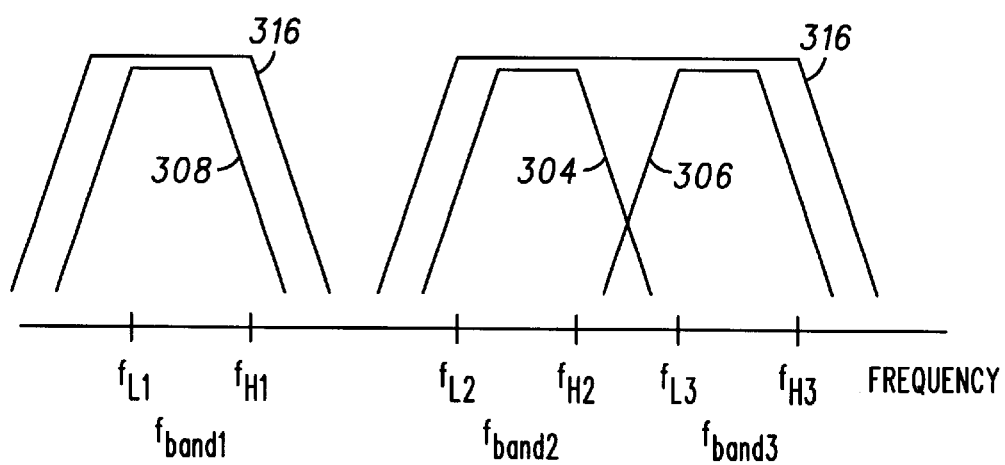
FIG. 2 is an illustration of a three passbands.

A multiple frequency band receiver receives at least two frequency bands that are close but not adjacent. A first bandpass filter passes signals in the first frequency band. A second bandpass filter passes signals in the second frequency band. The first and second filters each attenuate signals between the first and second frequency band to at least a first level so as to provide selectivity in the frequency range between the first and second frequencies to prevent the signals between these frequency bands from being further processed by the communication device. A third filter coupled to first and second filters passes signals in both the first and second frequency band and attenuates signals above the pass band of the higher of the first and second filters and below the lower of the first and second filters.

A wireless communication device 100 includes a receiver 102 and a transmitter 104. The transmitter and receiver communicate with other devices via an antenna 106. Signals detected by the antenna are filtered and demodulated in receiver 102. The output of the receiver is coupled to a controller 108. The controller 108 can be implemented using a microprocessor, a microcontroller, a digital signal processor, logic devices, or a combination thereof.

The controller outputs signals to transmitter 104 for communication to a remote device (not shown) via antenna 106. Signals received from the remote device for output via speaker 110 are processed in audio circuit 112. Microphone 114 inputs signals to the audio circuit are communicated via the transmitter.

The controller 108 also generates a reference signal for identifying the received signal band and also provides a reference signal to oscillator 116. Oscillator 116 generates a signal for demodulating the received signal to an intermediate frequency, as is known in the art.

The receiver 102 is preferably able to receive signals in frequency bands $f_{band1}$, $f_{band2}$ and $f_{band3}$. The frequency band $f_{band1}$ is the 900 MHz frequency band of GSM, $f_{band2}$ is the 1.8 GHz frequency band of DCS, and $f_{band3}$ is the 1.9 GHz frequency band of PCS. The communication device is preferably operative in all three frequency bands. However, the invention will find application in any multiple band receiver wherein two of the frequencies bands are close together, but still require separation between the pass bands thereof. In other words, the frequency range between each of the passbands must be attenuated by a predetermined amount to comply with the specifications/standards for these devices.

Figure 3:
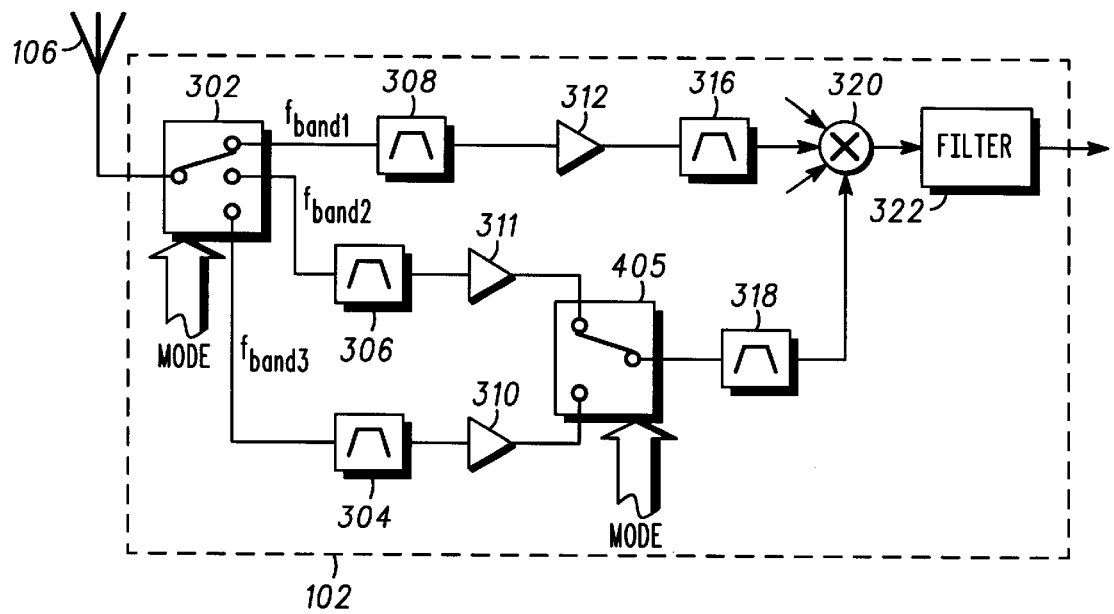
FIG. 3 is a circuit schematic illustrating a receiver for three pass bands of FIG. 2.

With reference to FIG. 3 a filter and demodulating circuit for the receiver 102 is disclosed. A switch 302 connected to antenna 106 outputs signals from antenna 106 to one of filters 304, 306 and 308 according to the mode, or frequency band, of operation of the communication device 100. The switch thus connects one of the filters according to one of the three frequencies at which the device is operating. The switch can be implemented using any suitable switch such as one utilizing PIN diodes and/or GaAs FETs. In particular antenna 106 is connected to filter 308 when the communication device is operating in a mode that uses $F_{band1}$. Antenna 106 is connected via switch 302 to filter 306 when the communication device is operating in a mode that uses $F_{band2}$. Similarly, antenna 106 is connected via switch 302 to filter 304 when the communication device is operating in a mode that uses $F_{band3}$.

In the illustrated example, the frequency band of filter 308 is significantly remote from the frequency bands 304 and 306, whereas the frequency bands of filters 304 and 306 are close, although not directly adjacent. Filters 304, 306 and 308 are band pass filters and can be implemented using any suitable filter type that passes a bandwidth of approximately 60 MHz, 75 MHz, and 35 MHz respectively. Filters 304, 306 and 308 provide selectivity within 20 MHz of the ends of their passbands.

The filter 308 outputs a signal to amplifier 312 which amplifies the received signal. The output of amplifier 312 is then input to filter 316 which provides additional filtering to the received signal. Filter 308 attenuates signals near the passband to a desired level before amplification in amplifier 312. Filter 316 provides additional attenuation to insure that frequencies remote from the desired passband are adequately attenuated to comply with applicable performance specifications/standards. Filter 316 can be implemented using any suitable filter type having a passband width of 35 MHz. Filter 316 does not provide attenuation very close to its passband. It typically will not provide attenuation until it is more than 20 MHz but less than 50 MHz away from the passband ends.

Signals output from filter 306 are amplified in amplifier 311 and input to a switch 314. Similarly, filter 304 removes signals outside of frequency band three prior to amplification in amplifier 310. The output of amplifier 310 is input to switch 314. Switch 314 is also mode dependent, such that the output of one of amplifiers 310 and 311 is input to a filter 318. The passband of filter 318 is slightly wider than the combined passband of filters 304 and 306, such that signals in $f_{band2}$ and $f_{band3}$ will both be passed by filter 318, but signals outside of these frequency bands, and more particularly signals above the upper frequency of band three and signals below the lower frequency of frequency band two will be attenuated. The filter 318 does provide additional filtering for $f_{band2}$ and $f_{band3}$ such that signals outside of these bands are attenuated to a significant degree as required by the specification. The output of filter 316 and 318 are input to demodulator 320 which generates an intermediate frequency signal. The intermediate frequency signal is input to a filter 322 which removes noise caused by the multiplexer 320.

The present invention permits the single filter 318 to be used to provide the necessary attenuation needed further from the passband of the receiver when operating in either $F_{band2}$ or $f_{band3}$. The use of a single filter eliminates the need to provide two filters, and thereby reduces the cost of the receiver without significantly degrading the performance thereof. It should be noted, that the filters 304 and 306 are required to attenuate the signal between the high frequency F2H of $f_{band2}$ and the low frequency F3L of $f_{band3}$. Additionally, the summation of the two filters, either filter 304 plus 318 or filter 306 plus 318, provides the necessary attenuation of signals remote from the passband of the receiver during a particular mode of operation as required by the standards and performance specifications.

Switches 302 and 314 provide isolation between the signal path through filter 304 and amplifier 310 and the signal path through filter 306 and amplifier 311.

Figure 4:
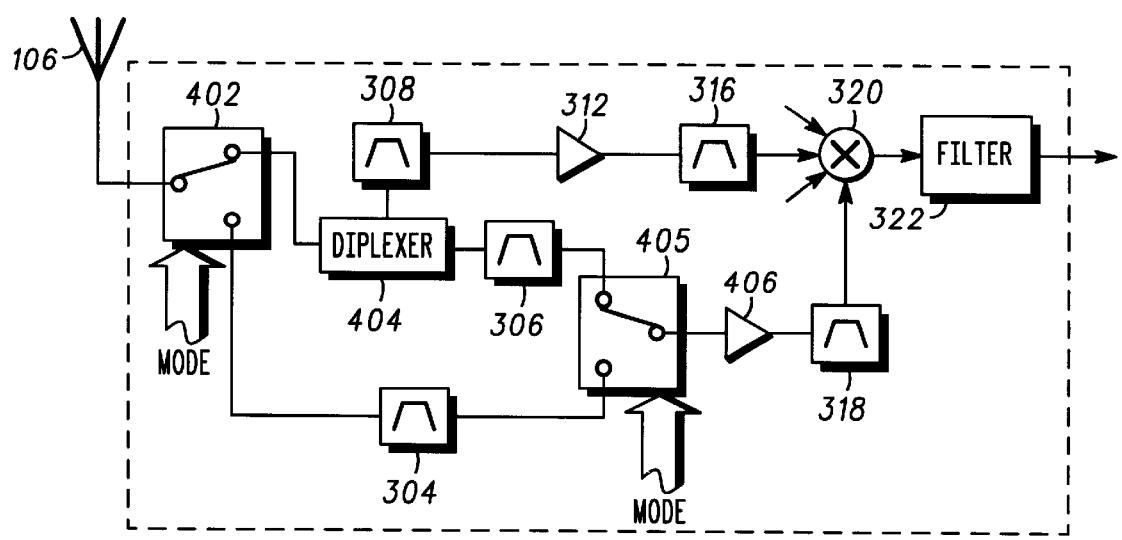
FIG. 4 is a circuit schematic illustrating an alternate receiver for three pass bands of FIG. 2.

According to an alternate embodiment, the switch 302 can be replaced by switch 402 and a diplexer 404 as shown in FIG. 4. The output of multiplexer 404 is output to a filter 308 and filter 306. Signals within the passband of filter 308 will be output by the diplexer and isolated from filter 306. Similarly, the signals in the desired passband of filter 306 will be output to filter 306 and isolated from filter 308. The switch 402 is used to isolate signals in the passband of frequency band two and frequency band three, as the diplexer cannot adequately perform this function. Thus, switch 402 passes signals from antenna 106 to diplexer 404 when the device is in the mode of passing signals in the frequency band of filter 308 or 306. Switch 402 connects filter 304 to antenna 106 when the device is in a mode of operation using the passband of filter 304.

The filters 304 and 306 can be connected through a switch 405 which isolates amplifiers 304 and 306. The output of switch 405 is input to amplifier 406 which amplifies the signal input thereto. The output of amplifier 406 is input to a filter 318 which provides additional filtering to provide the necessary attenuation of signals outside of the passband of filters two and three, while passing signals in frequency bands 304 and the passband of filter 306 without any significant attenuation. The output of filters 318 and 316 are input to multiplexer 320 which generates a signal at an intermediate frequency for further processing. Filter 322 removes noise introduced by multiplexer 320.

Figure 5:
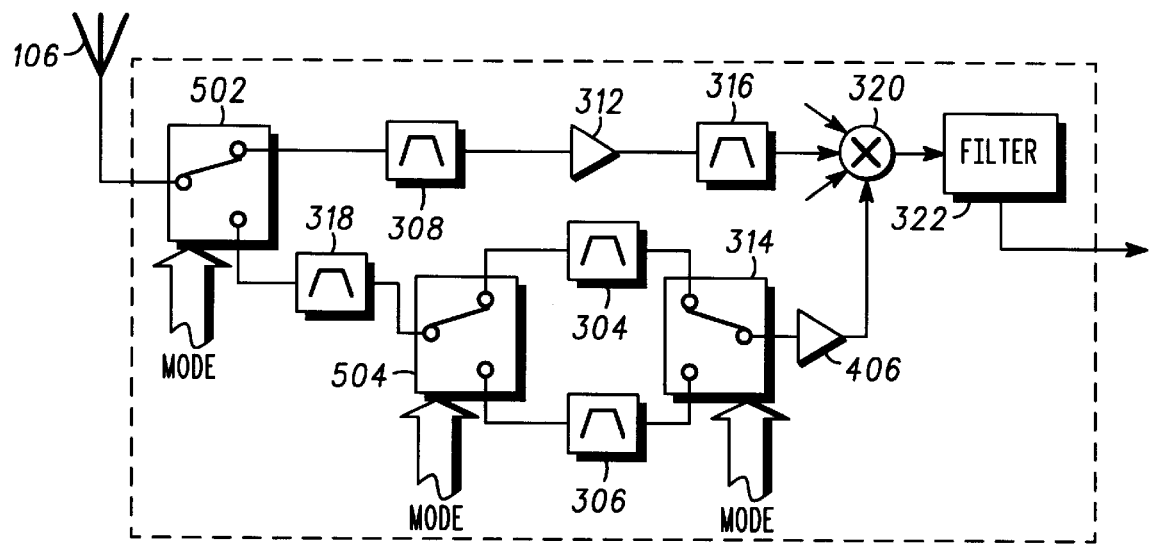
FIG. 5 is a circuit schematic illustrating another alternate receiver for three pass bands of FIG. 2.

With reference to FIG. 5, switch 502 is used to isolate signals in the frequency band of filter 308 from signals in the frequency bands of filters 304 and 306. Signals output from switch 502 in the passband of filters 304 and 306 will first be filtered in filter 318, which provides attenuation above the upper frequency band F3H and below the lower frequency F2L, but passes signals in $f_{band2}$ and $f_{band3}$. Depending on the mode of operation, the switch 504 passes the output of filter 318 either to filter 304 or to filter 306. Switch 314 connects the output of filter 304 or the output of filter 306 to amplifier 406. Amplifier 406 is connected to multiplexer 320 which demodulates signals from filter 316 or amplifier 406 into an intermediate frequency. Filter 322 removes noise introduced by the multiplexer 320.

Figure 6:
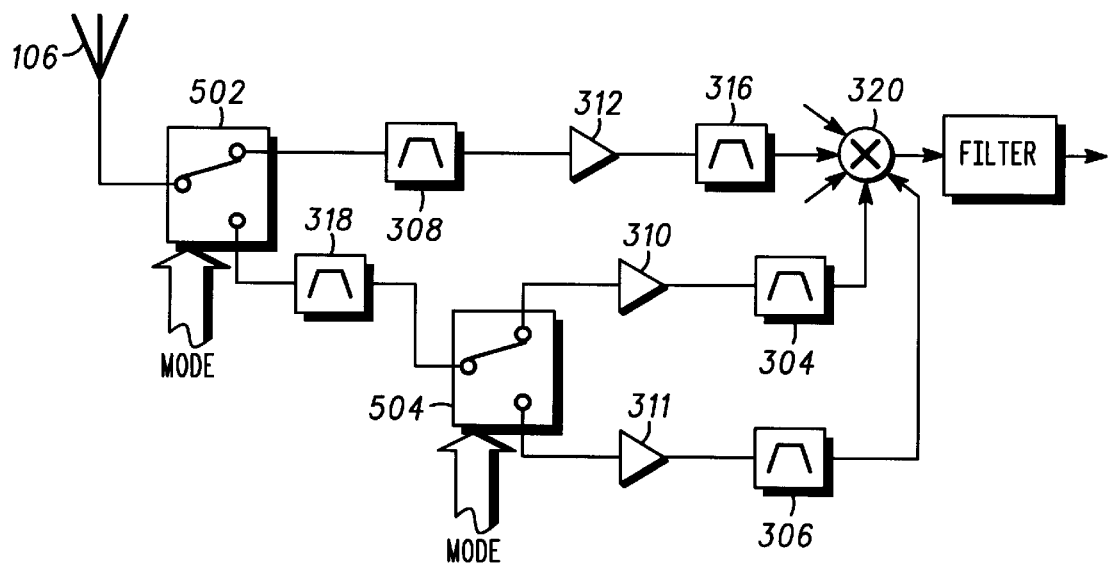
FIG. 6 is a circuit schematic illustrating another receiver for three pass bands of FIG. 2.

According to yet another alternate embodiment, shown in FIG. 6, switch 504 is connected to amplifiers 310 and 311 which in turn are connected to respective filters 304 and 306. Signals in the passband of filter 304 will be amplified in amplifier 310 and input directly to multiplexer 320 from filter 304. Similarly, signals in the passband of filter 306 will be amplified by amplifier 311 filtered by filter 306 to pass only the passband of frequency band two and diplexed in multiplexer 320.

Figure 7:
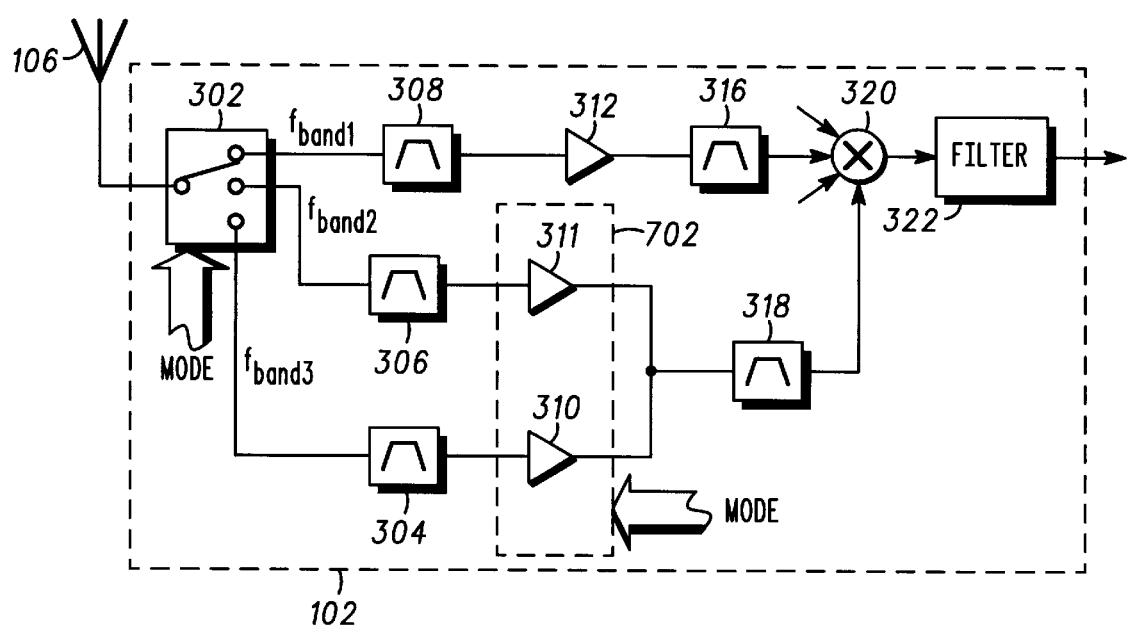
FIG. 7 is a circuit schematic illustrating another receiver for three pass bands of FIG. 2.

FIG. 7 illustrates an embodiment substantially similar to the embodiment of FIG. 3, except that a diplexed amplifier circuit 702 is used. The diplexed amplifier 702 is responsive to the mode control signal from controller 108 to select one of the amplifiers 310, 311, the output of which is input directly to filter 308.

It can be seen that multiple band filter and multiplexing circuitry is disclosed which reduces the components necessary to effectively provide multiple band operation according to required specifications. Circuits can be provided in a smaller space and at a lower cost. Space savings are particularly important where the device is to be manufactured in the smallest possible volume.

Although the invention has been described and illustrated in the above description and drawings, it is understood that this description is by way of example only and that numerous changes and modifications can be made by those skilled in the art without departing from the true spirit and scope of the invention. Although the present invention finds particular application in portable wireless devices such as cellular radiotelephones, the invention could be applied to any device employing multiple frequency bands, including other types of telephony equipment. The invention should be limited only by the following claims.

What is claimed:

1. A multiple frequency band receiver wherein at least two of the frequency bands are close but not adjacent, comprising:

an antenna receiving radio frequency signals;
a first bandpass filter coupled to the antenna to pass received signals in the first frequency band;
a second bandpass filter coupled to the antenna to pass received signals in the second frequency band, wherein the first and second filters provide selectivity in the frequency range between the first and second frequencies to prevent the signals between these frequency bands from being further processed by the communication device;
a third filter coupled to first and second filters, the third filter passing the received signals in both the first and second frequency band and attenuating signals above the pass band of the higher of the first and second filters and below the lower of the first and second filters prior to multiplexer conversion in the receiver; and a multiplexer coupled to the output of the third filter to produce a converted signal for further processing.

2. The multiple frequency band receiver as defined in claim 1, further including at least one amplifier between the first filter and the third filter.

3. The multiple frequency band receiver as defined in claim 1, further including a switch having a first input coupled to an output of the first filter and a second input coupled to an output of the second filter, the switch selectively coupling one of the first and second filters to the third filter.

4. The multiple frequency band receiver as defined in claim 2, further including a second amplifier coupled between the second filter and the third filter.

5. The multiple frequency band receiver as defined in claim 4, further including a switch coupled to the first amplifier, the second amplifier, and the third filter, the switch selectively coupling one of the first and second amplifiers to the third filter.

6. The multiple frequency band receiver as defined in claim 1, further including a switch having an input for receipt of a receiver signal and outputting the receiver signal to the first and second filters.

7. The multiple frequency band receiver as defined in claim 6, further including a fourth filter for passing signals in a third frequency band, the third frequency band being remote from the first and second frequency bands, the fourth filter coupled to the switch.

8. The multiple frequency band receiver as defined in claim 7, wherein the multiplexer is coupled to receive signals passed by the third filter at one input and signals passed by the fourth filter at another input.

9. The multiple frequency band receiver as defined in claim 8, further including a diplexer coupled between one output of the switch and the second and fourth filters, the first filter being coupled to the switch.

10. The multiple frequency band receiver as defined in claim 1, wherein the third filter is coupled to an antenna ahead of the first and second filters, the output of at least one of the first and second filters coupled to a multiplexer.

11. In a multiple frequency band receiver having a receiver passband, the receiver including at least first and second bandpass filters to filter at least first and second frequency bands respectively that are close but not adjacent, a method comprising the steps of:

selectively filtering a received signal in at least one of the first bandpass filter and second bandpass filters, wherein the first and second bandpass filters provide selectivity in the frequency range between the first and second frequencies to prevent the signals between these frequency bands from being further processed by the communication device;

filtering the signals output by the first and third filters in a third filter passing signals in the frequency range between the lowest frequency of the first bandpass filter and the highest frequency of the second bandpass filter, the third filter attenuating signals below the pass band of the first filter and above the pass band of the second bandpass filter to substantially attenuate signals remote from the passband of the receiver prior to conversion of the received signal in the receiver; and converting a signal output by the third filter.

12. The method as defined in as defined in claim 11, further including the step of amplifying the output of the first amplifier prior to filtering in the third filter.

13. The method as defined in as defined in claim 11, further including the step of selectively coupling an output of the first filter and an output of the second filter to an input of the third filter.

14. The method as defined in claim 11, further including the step of amplifying the output of the second filter prior to filtering in the third filter.

15. The method as defined in claim 11, further including the step of amplifying the output of at least one of the first amplifier and the second amplifier prior to filtering in the third filter.

16. The method as defined in claim 11, further including selectively coupling the first and second filters to receive a receiver signal.

17. The method as defined in claim 16, further including the step of selectively filtering the received signals in a fourth filter passing signals in a third frequency band, the third frequency band being remote from the first and second frequency bands, the fourth filter selectively coupled to receive the receiver signal, and the step of converting including selectively converting the output of the fourth filter.

18. The method as defined in claim 17, wherein the step of converting a signal output by the third filter includes selectively converting signals passed by the third filter and the fourth filter.

* * * * *